United States Patent [19]

Goto

[11] Patent Number: 4,693,865
[45] Date of Patent: Sep. 15, 1987

[54] SUPERCONDUCTIVE ALLOY FILAMENT

[75] Inventor: Tomoko Goto, Nagoya, Japan

[73] Assignee: Nagoya Institute of Technology, Nagoya, Japan

[21] Appl. No.: 836,443

[22] Filed: Mar. 5, 1986

[30] Foreign Application Priority Data

Apr. 2, 1985 [JP] Japan .................................. 60-68568

[51] Int. Cl.⁴ ............................................ C22C 11/08
[52] U.S. Cl. .................................... 420/572; 420/580
[58] Field of Search ................ 420/572, 580; 428/606, 428/930

[56] References Cited

U.S. PATENT DOCUMENTS 1,021,997 4/1912 Morrison .............................. 420/563
3,301,642 1/1967 Youssef ................................ 420/563

Primary Examiner—Peter D. Rosenberg
Attorney, Agent, or Firm—Young & Thompson

[57] ABSTRACT

A superconductive Pb-Bi-(Te or Sb) system trinal alloy continuous filament with a high superconducting transition temperature of at least 9.0° K. and high tenacity and ductility is provided. The filament according to the invention can be efficiently manufactured in one stage with high stability and productivity, by utilizing the so-called Taylor process for producing metallic filament.

7 Claims, 3 Drawing Figures

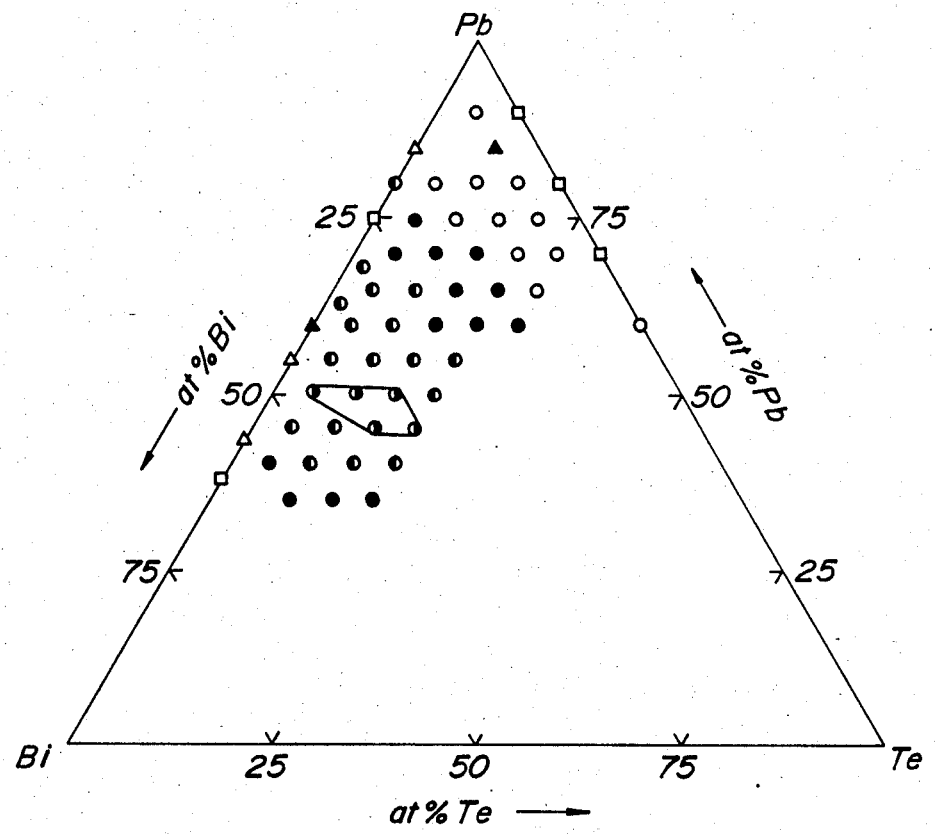
FIG_2

FIG_3
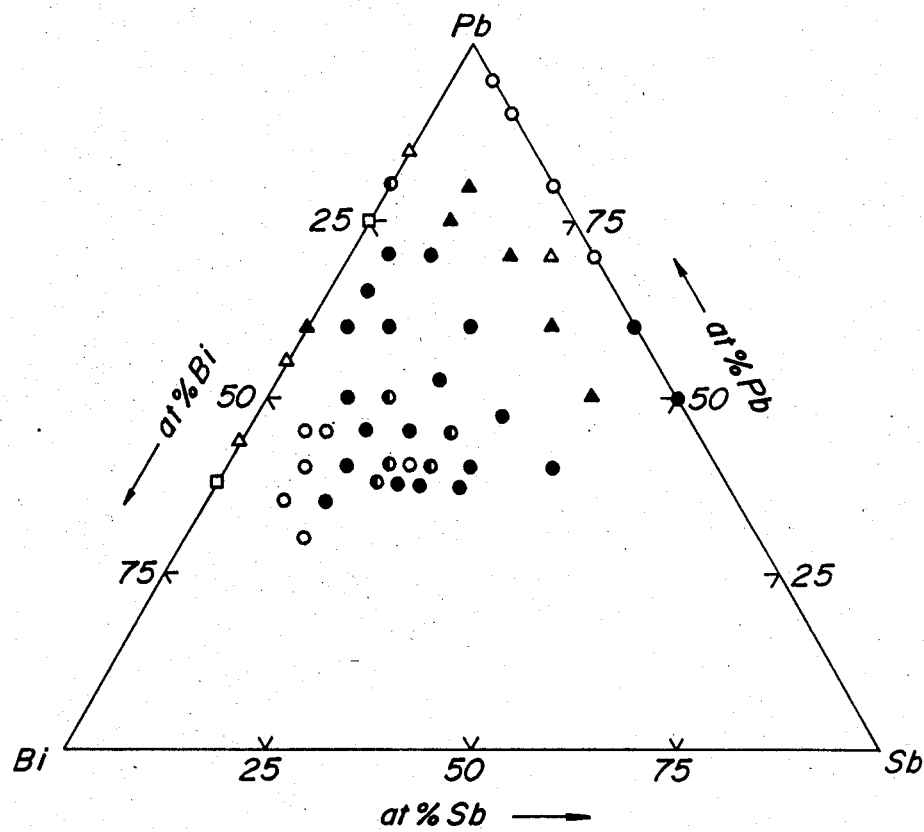
□ <7.4K
△ 7.5-7.9K
▲ 8.0-8.4K
○ 8.5-8.9K
● 9.0-9.4K
◐ 9.5-9.9K
◉ 10.0-10.4K

SUPERCONDUCTIVE ALLOY FILAMENT

BACKGROUND OF THE INVENTION

1. Field of the Invention

The present invention relates to a superconductive Pb-Bi-(Te or Sb) system ternary alloy continuous filament with a high superconducting transition temperature (hereinafter referred to as $T_c$).

2. Related Art Statement

Heretofore, many attempts have been made to develop superconductors with high $T_c$, which are useful in large-scale engineering applications such as superconducting magnets, power transmission lines, etc. For such applications, superconductors are generally used in the form of ultra-fine continuous filament composing a multi-core wire. Superconductors with high $T_c$, however, are usually brittle and difficult to fabricate into fine tapes or filaments, so that great many efforts have so far been concentrated on the manufacture of such filaments, etc.

Thereupon, it was found by the applicant, as reported by the article titled "The Glass-Coated Melt Spinning of Superconductors" printed in Trans. J.I.M., 22: 753 (1981), that a superconductive continuous filament could be produced by the glass-coated melt spinning process, i.e. the so-called "Taylor process", whereby fine filament of metal and alloys can be produced directly from the molten state in one stage. Using the Taylor process, the applicant tried the melt spinning of various germanium alloys such as Ge-Pb, Ge-Sn and Ge-Bi system alloys for producing a superconductive continuous filament, and observed the maximum $T_c$ of no more than 7.1° K. for $Ge_{25}Pb_{75}$ filament and 4.9° K. for $Ge_{75}Sn_{25}$ filament (Advances in Cryogenic Engineering, Vol. 30: 699–706, Edited by A. F. Clark and R. P. Reed). Further, with respect to Pb-Bi alloy filament, the applicant prepared $Pb_{80}Bi_{20}$ filament with high $T_c$ of 11.0° K. by using the Taylor process (Trans. J.I.M. Vol. 25: No. 5, 1984) and, furthermore, the applicant and N. Waku confirmed and reported some Pb-Bi-Ge system ternary alloy filaments exhibited superconductivity at a temperature higher than 10° K., especially $Pb_{49}Bi_{33}Ge_{18}$ filament had the maximum $T_c$ of 14.3° K. (J. Mater. Sci., Vol. 20: p. 532, 1985).

Thus, in the above-mentioned experiments, it was found that the addition of germanium and tellurium to tin or lead resulted in the enhancement of $T_c$. However, further studies have revealed that these filaments are generally very difficult to spin for lack of fiber-formability or spinability of alloys, wherefore the yield and productivity will be extremely low and, moreover, that the high $T_c$ for $Pb_{80}Bi_{20}$ filament is difficult to reproduce, so that it seems quite probable to have been accidentally obtained within a very narrow composition range.

Accordingly, this applicant launched out further into a series of studies on Pb-Bi-Te and Pb-Bi-Sb system alloys, aiming at obtaining superconductive continuous filaments with high $T_c$ as well as high stability and productivity, which have so far never been investigated, and eventually accomplished the present invention.

SUMMARY OF THE INVENTION

An object of the present invention is to obtain a superconductive continuous metallic filament with high $T_c$.

The ultimate object of the invention is to provide superconducting power transmission cables, superconductive magnets, etc. at low cost.

The above objects of the invention can be attained by a superconductive alloy continuous filament with a high superconducting transition temperature ($T_c$) and high strength and ductility, which comprises a ternary alloy with a composition represented by the general formula:

$$Pb_x \cdot Bi_y \cdot M_z \qquad (I)$$

where, M represents Te or Sb; x is an atomic % from 30 to 80; y, from 15 to 55 when M is Te, or from 20 to 50 when Sb; and z, from 2 to 25 when M is Te, or from 5 to 30 when Sb; and $x+y+z=100$.

The filament of the present invention is manufactured by a process which comprises: heating in an inert gas atmosphere, a mixture of metallic materials for a Pb-Bi-(Te or Sb) system ternary alloy with a predetermined composition, placed in a glass tube, to melt together with the glass; attenuating the melt by drawing downwards to form a glass-coated metallic filament; cooling the filament at a cooling rate of $10^4$–$10^{6°}$ K./sec, before winding on a take-up drum; and thereafter removing the glass-coating with a solvent for the glass.

BRIEF DESCRIPTION OF THE DRAWING

Some embodiments of the invention will now be described by way of example and with reference to the accompanying drawings in which:

FIGS. 2 and 3 are ternary diagrams respectively showing plots of $T_c$ for alloy filaments with various compositions.

DESCRIPTION OF THE PREFERRED EMBODIMENTS

Figure 1:
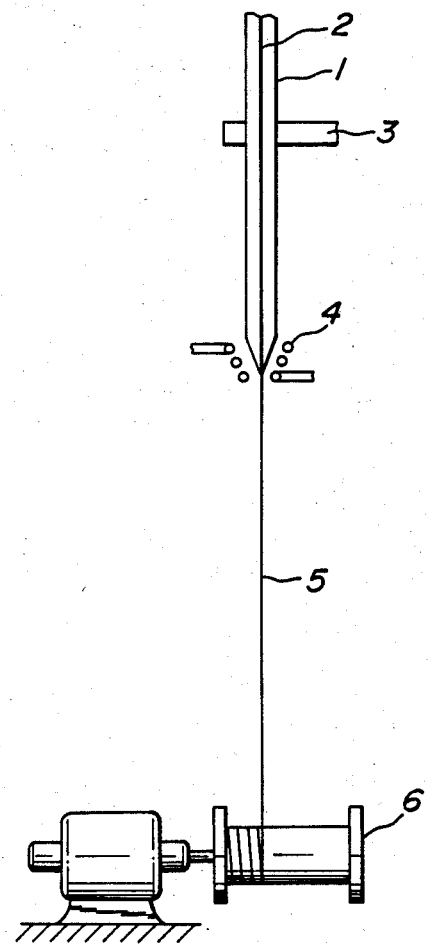
FIG. 1 is a schematic, elevational view of a spinning machine to be applied to the manufacture of the filament of the present invention.

The melt spinning of Pb-Bi-(Te or Sb) system alloys can be carried out utilizing the so-called Taylor process for producing metallic filaments as follows:

In FIG. 1, a mixture of metallic materials 2 consisting of lead, bismuth and tellurium or antimony with an appropriate composition is placed in glass tube 1, e.g. of Pyrex glass and the bottom tip of the mixture is heated at a temperature about 1,500° K. by heater device 4 such as a radio-frequency induction heater, to melt together with the glass tube. When the molten glass tube containing the molten alloy is drawn downwards, the alloy is stretched and attenuated to form glass-coated metallic filament 5. Being cooled down at a cooling rate of $10^4$–$10^{6°}$ K./sec, preferably about $10^{5°}$ K./sec, from the molten state, spun filament 5 is wound on take-up drum 6 with a winding speed of not exceeding about 220 m/min. The melt spinning operation must be performed in an inert gas atmosphere such as argon or helium gas, to prevent the molten alloy from reacting with ambient gas. As the spinning proceeds, glass tube 1 containing the mixture of metallic materials is lowered by lowering device 3 driven e.g. by a motor, to feed metallic materials to the heater device.

The glass-coated metallic filament wound on the take-up drum is then treated with a solvent for glass, such as hydrogen fluoride aqueous solution or fused caustic alkali, to remove the glass-coating.

Thus, alloy, fine continuous filaments can be produced directly from the molten metal in one stage.

Moreover, the process of the present invention gives filaments a cooling rate of at least $10^{4\circ}$ K./sec, preferably at least $10^{5\circ}$ K./sec, from a molten state and makes possible to form a metastable phase or uniformly mixed alloy, even though the component metals are immiscible in bulk form or an unstable equilibrium phase is usually apt to form. So, the filament formed according to the invention has a lustrous smooth surface and is free from pinholes and is finely polycrystalline with grain size of about $2,000 \times 10^{-10}$ m in diameter.

Moreover, it is surprising that, although lead and bismuth are immiscible in tellurium, these elements are distributed homogeneously in the filament obtained according to the process of the invention, and segregations around the boundary of the crystalline particle are not observed for the special elements. This fact is believed to relate closely to high spinability of the ternary alloy employed in the present invention as well as good productivity of the process of the invention.

The Pb-Bi-Te system alloy continuous filaments containing up to 25 at. % Te produced according to the aforementioned process, generally have a diameter ranging from $20 \times 10^{-6}$ m to $40 \times 10^{-6}$ m. Those filaments are a ductile material with a tensile strength of at least 20 MPa and elongation of at least 2.0%.

Among such various Pb-Bi-Te system ternary alloy continuous filaments, the filament according to the present invention comprises a ternary alloy with a composition represented by the formula:

$$Pb_x \cdot Bi_y \cdot Te_z \qquad (II)$$

where, x means an atomic % from 30 to 80; y, from 15 to 55; z, from 2 to 25; and $x+y+z=100$.

The composition of Pb-Bi-Te system alloy filament of the present invention exhibiting a $T_c$ of at least $9.0^\circ$ K. falls in the range defined by the above formula (II), and further that exhibiting a higher $T_c$ of at least $9.5^\circ$ K. will be in the range defined when x is 40-70; y, 25-50; and z, 2-20. Particularly, in the case where x is 45-50; y, 35-45; z, 5-20; and $x+y+z=100$, such an alloy filament has a $T_c$ of $10.0^\circ$ K. or higher.

As to the Pb-Bi-Sb system alloy continuous filaments containing up to 40 at. % Sb produced according to the process of the invention, the diameter will generally range from $10 \times 10^{-10}$ m to $20 \times 10^{-10}$ m. The filament containing more than 20 at. % Sb will tend to be a brittle material having a tensile strength of about 20 MPa with elongation of up to about 1%, and when the Sb content exceeds 30 at. %, the tenacity will be too low either to spin continuously or to put the filament to practical use.

Among various Pb-Bi-Sb system ternary alloy filaments, the filament according to the present invention comprises a ternary alloy with a composition represented by the formula:

$$Pb_x \cdot Bi_y \cdot Sb_z \qquad (III)$$

where, x means an atomic % from 30 to 80; y, from 20 to 50; z, from 5 to 30; and $x+y+z=100$.

The composition of Pb-Bi-Sb system alloy filament of the present invention exhibiting a $T_c$ of at least $9.0^\circ$ K. falls in the range defined by the above formula (III), and further that exhibiting a higher $T_c$ of at least $9.5^\circ$ K. will be in the range defined when x is 35-55; y, 30-45; and z 15-25.

According to the process of the invention, the above-mentioned high $T_c$ of the filament appears with high stability and reproducibility in the composition range defined above.

The present invention will be explained in more detail by way of the following examples. In examples, the tensile strength of the filaments was measured with an Instron type machine and the microstructure of the filament was studied using an X-ray diffractometer, an X-ray microanalyzer and a differential thermal analysis. The $T_c$ of the filament was determined by measuring changes in resistivity of the filament as a function of temperature using a chromel-gold+0.007% iron thermocouple and germanium resistance thermometer. The sample current density was of the order of $10^6$ A/m$^2$. The $T_c$ was chosen as the temperature where the filament resistance had reached half of its normal value.

EXAMPLE 1

Using a melt-spinning apparatus as shown in FIG. 1, the melt-spinning of $Pb_x \cdot Bi_y \cdot Te_z$ ($y \leq 55$, $z \leq 25$ at. %) was carried out as follows.

One gram of a mixture of lead, bismuth and tellurium of appropriate composition was placed in a Pyrex glass tube and the bottom tip of the glass tube was melted by radio-frequency induction heating at a temperature of about $1,500^\circ$ K. in an argon gas atmosphere. When the molten glass tube containing the molten alloy was drawn downwards, the alloy was stretched and attenuated to form a glass-coated fine metallic filament and was wound on a take-up drum with a winding speed of about 160 m/min. The glass-coating was removed in a 45% hydrogen fluoride aqueous solution. The filament had lustrous smooth surface and was free from pinholes. The diameter of the filament obtained ranged from $20 \times 10^{-6}$ m to $40 \times 10^{-6}$ m. Most of the filaments were a ductile material with a tensile strength of 20 MPa and elongation of more than 2.0%. $T_c$ of the filaments with various compositions was also measured and the results are plotted on the ternary diagram of FIG. 2. By adding tellurium, the filament exhibited higher $T_c$ than that of Pb-Bi binary alloy filament. FIG. 2 shows the high $T_c$ of at least $9.0^\circ$ K. is observed in the range of 30-80 at. % Pb, 15-55 at. % Bi and 2-25 at. % Te, and the higher $T_c$ of at least $9.5^\circ$ K., in the range of 40-70 at. % Pb, 25-50 at. % Bi and 2-20 at. % Te. The highest $T_c$ field having at least $10^\circ$ K., i.e. 45-50 at. % Pb, 35-45 at. % Bi and 5-20 at. % Te, is shown by the closed curve in FIG. 2.

The crystal structure of the filament with the highest $T_c$ was a mixed structure of Te (hexagonal), $\epsilon$ (h.c.p.) and Bi (ternary) phases.

Surfaces and cross-sections of the filament were examined with an X-ray microanalyzer. The lead, bismuth and tellurium elements distributed homogeneously in the filament. Segregation of individual elements around the boundary of the crystalline particle was not observed.

The thermal stability of the filament was examined with a differential thermal analysis (DTA) curve of the $Pb_{45}Bi_{40}Te_{15}$ filament. The curve showed an irreversible broad exothermic peak from $735^\circ$ K. to $852^\circ$ K., which was considered to arise from the decomposition of the filament. Then the glass-coated filament was annealed at $823^\circ$ K. for 10 minutes and then the coating glass was removed by HF aqueous solution. The $T_c$ of the annealed filament obtained by this method was measured. It is to be noted that the filament had high $T_c$ of $9.8^\circ$ K. The particle size of the annealed filament was found to be $2,000 \times 10^{-10}$ m, the same as that for as-drawn filament.

COMPARATIVE EXAMPLE

The melt spinning of Pb-Cd, Pb-Se, Pb-Sb, Sn-Sb, Pb-Sn-Sb alloys was carried out in the same manner as Example 1 for producing the superconducting continuous filament with high $T_c$. Continuous filaments of $Pb_{95}Cd_5$ and $Pb_{80}Se_{20}$ alloys could not be obtained because of the instability of the molten alloy at high temperature such as 1,500° K. Long continuous filaments of Pb-Sb, Sn-Sb and Pb-Sn-Sb alloys respectively were produced. The average diameter, tensile strength, $T_c$ and crystal structure of the Pb-Sb system alloy filament are shown in Table 1. The Sn-Sb alloy filaments did not exhibit superconductivity at higher temperature than 4.2° K. By adding a small amount of antimony to lead, the $T_c$ increased drastically. A high $T_c$ of 9.1° K. was observed for the $Pb_{50}Sb_{50}$ filament, but it was rather brittle and had low spinability. However, a large enhancement of $T_c$ was not observed for Pb-Sn-Sb ternary alloy filament.

TABLE 1

| Alloy filament | Diameter ($10^{-6}$ m) | Tensile strength (MPa) | Elongation (%) | $T_c$ (°K.) | Crystal structure |
|---|---|---|---|---|---|
| $Pb_{95}Sb_5$ | 16 | 40 | 0.9 | 8.5 | Pb |
| $Pb_{90}Sb_{10}$ | 30 | 50 | 1.6 | 8.5 | Pb |
| $Pb_{80}Sb_{20}$ | 28 | 59 | 2.2 | 8.5 | Pb + Sb |
| $Pb_{70}Sb_{30}$ | 24 | 56 | 2.6 | 8.5 | Pb + Sb |
| $Pb_{60}Sb_{40}$ | 22 | 49 | 0.9 | 9.0 | Pb + Sb |
| $Pb_{50}Sb_{50}$ | 13 | 29 | 1.6 | 9.1 | Pb + Sb |
| $Pb_{50}Sn_{20}Sb_{30}$ | 12 | 79 | 1.7 | 7.6 | Pb + Sb |

EXAMPLE 2

The melt spinning of Pb-Bi-Sb system alloys cotaining up to 40 at. % Sb was carried out in the same manner as Example 1 as for Pb-Bi-Te filament. The diameter of the filament obtained ranged from $10 \times 10^{-10}$ m to $20 \times 10^{-10}$ m. Most of the filaments were a ductile material but the filament containing more than 20 at. % Sb was brittle. A continuous filament could not be obtained for the alloy containing more than 30 at. % Sb. $T_c$ for the filaments with various compositions was measured and is plotted on the ternary diagram of FIG. 3. The addition of antimony resulted in the enhancement of the filament obtained. From FIG. 3, it can be understood that the high $T_c$ of at least 9.0° K. is observed in the range of 30–80 at. % Pb, 20–50 at. % Bi and 5–30 at. % Sb, and a higher $T_c$ of at least 9.5° K.; 35–55 at. % Pb, 30–45 at. % Bi and 15–25 at. % Sb.

The crystal structure of the filament with the higher $T_c$ was a mixed phase of Bi (ternary), $\epsilon$ (h.c.p.) and metastable Sb (ternary) structures.

As is clear from the foregoing explanation, the process of the present invention gives filaments for a cooling rate of at least 10⁴° K./sec, generally about 10⁵° K./sec, from a molten state and has made possible to form the metastable phase or uniformly mixed alloy without forming an unequilibrium phase, notwithstanding each elements are immiscible in bulk form. Thus, according to the present invention, new types of superconductive alloy fine continuous filament with high $T_c$ and improved strength and ductility can be produced directly from metals in one stage, with high stability and productivity. Accordingly, the present invention is of great advantage to commercial possibilities of superconducting power transmission cables, etc. at low cost.

What is claimed is:

1. A superconductive alloy continuous filament with a high superconducting transition temperature ($T_c$) and high strength and ductility, which comprises a ternary alloy with a composition represented by the general formual:

$$Pb_x.Bi_y.M_z \qquad (I)$$

where, M represents a metallic element selected from Te and Sb; x is an atomic % from 30 to 80; y, from 15 to 55 when M is Te, or from 20 to 50 when Sb; z, from 2 to 25 when M is Te, or from 5 to 30 when Sb; and $x+y+z=100$.

2. A filament as claimed in claim 1, wherein the $T_c$ is at least 9.0° K.

3. A filament as claimed in claim 1, wherein the ternary alloy is a Pb-Bi-Te system alloy with a composition represented by the formula:

$$Pb_x.Bi_y.Te_z \qquad (II)$$

where, x is an atomic % from 40 to 70; y, from 25 to 50; z, from 2 to 20; and $x+y+z=100$; and the $T_c$ is at least 9.5° K.

4. A filament as claimed in claim 1, wherein x is 45 to 50; y, 35 to 45; z, 5 to 20; and $x+y+z=100$; and the $T_c$ is at least 10.0° K.

5. A filament as claimed in claim 1, wherein the ternary alloy is a Pb-Bi-Sb system alloy with a composition represened by the formula:

$$Pb_x.Bi_y.Sb_z \qquad (III)$$

where, x is an atomic % from 35 to 55; y, from 30 to 45; z, from 15 to 25; and $x+y+z=100$; and the $T_c$ is at least 9.5° K.

6. A filament as claimed in claim 3, whose diameter is from $20 \times 10^{-6}$ m to $40 \times 10^{-6}$ m.

7. A filament as claimed in claim 5, whose diameter is from $10 \times 10^{-10}$ m to $20 \times 10^{-10}$ m.

* * * * *